(12) United States Patent
Lee et al.

(10) Patent No.: US 9,062,710 B2
(45) Date of Patent: Jun. 23, 2015

(54) COMBINED LOAD ROLLING BEARING

(71) Applicants: Brian Lee, York, SC (US); James Kevin Brown, Rock Hill, SC (US)

(72) Inventors: Brian Lee, York, SC (US); James Kevin Brown, Rock Hill, SC (US)

(73) Assignee: Schaeffler Technologies AG & Co. KG, Herzogenaurach (DE)

(*) Notice: Subject to any disclaimer, the term of this patent is extended or adjusted under 35 U.S.C. 154(b) by 15 days.

(21) Appl. No.: 14/169,904

(22) Filed: Jan. 31, 2014

(65) Prior Publication Data
US 2014/0219594 A1    Aug. 7, 2014

Related U.S. Application Data

(60) Provisional application No. 61/760,936, filed on Feb. 5, 2013.

(51) Int. Cl.
| | |
|---|---|
| F16C 19/34 | (2006.01) |
| F16C 19/54 | (2006.01) |
| F16C 33/46 | (2006.01) |
| F16C 19/38 | (2006.01) |
| F16C 19/46 | (2006.01) |
| F16C 33/48 | (2006.01) |
| F16C 33/58 | (2006.01) |

(52) U.S. Cl.
CPC ........... *F16C 19/381* (2013.01); *F16C 33/4635* (2013.01); *F16C 19/463* (2013.01); *F16C 33/48* (2013.01); *F16C 33/585* (2013.01)

(58) Field of Classification Search
CPC .... F16C 19/305; F16C 19/361; F16C 19/545; F16C 19/56; F16C 33/4605; F16C 33/4642; F16C 33/485

USPC ................ 384/455–456, 565, 597, 572, 618, 384/621–623, 551, 619
See application file for complete search history.

(56) References Cited

U.S. PATENT DOCUMENTS

| | | | | | |
|---|---|---|---|---|---|
| 3,168,359 | A | * | 2/1965 | Murphy | 384/454 |
| 3,275,391 | A | * | 9/1966 | Blais | 384/447 |
| 3,341,263 | A | * | 9/1967 | Pitner | 384/455 |
| 3,632,178 | A | * | 1/1972 | Pitner | 384/455 |
| 3,652,141 | A | * | 3/1972 | Husten et al. | 384/455 |
| 3,829,181 | A | * | 8/1974 | Gunther et al. | 384/455 |
| 3,930,692 | A | * | 1/1976 | Condon et al. | 384/455 |
| 3,934,956 | A | * | 1/1976 | Pitner | 384/455 |

(Continued)

FOREIGN PATENT DOCUMENTS

| | | |
|---|---|---|
| DE | 859699 C | 12/1952 |
| DE | 2810116 A1 | 9/1979 |

(Continued)

*Primary Examiner* — Marcus Charles
(74) *Attorney, Agent, or Firm* — Volpe and Koenig, P.C.

(57) ABSTRACT

A combined load rolling bearing including a roller assembly with a first cage including a plurality of radial cylindrical rollers and a plurality of axial cylindrical rollers is provided. The radial cylindrical rollers are supported so that they can roll on a radially outer race of a first bearing ring and a radially inner race of a second bearing ring. The axial cylindrical rollers are supported so that they can roll on a first axial race of the first bearing ring and an intermediate axial ring. A needle roller assembly is supported between the intermediate axial ring and a second axial race of the second bearing ring. The needle roller assembly includes a second cage with a plurality of needle rollers and the needle roller assembly rotates at a speed differential between the radial cylindrical rollers and the axial cylindrical rollers.

10 Claims, 3 Drawing Sheets

(56) References Cited

U.S. PATENT DOCUMENTS

| | | | |
|---|---|---|---|
| 3,960,413 A * | 6/1976 | Abbuhl et al. | 384/47 |
| RE29,583 E * | 3/1978 | Eckhardt et al. | 384/455 |
| 4,422,697 A * | 12/1983 | Gugel et al. | 384/452 |
| 4,515,415 A * | 5/1985 | Szenger | 384/44 |
| 4,573,811 A * | 3/1986 | Andree et al. | 384/622 |
| 4,687,345 A * | 8/1987 | Geka | 384/44 |
| 4,861,171 A * | 8/1989 | Adachi | 384/455 |
| 4,906,112 A * | 3/1990 | Gobel et al. | 384/548 |
| 4,971,460 A * | 11/1990 | Muntnich et al. | 384/452 |
| 5,074,677 A * | 12/1991 | Andree et al. | 384/448 |
| 5,829,890 A * | 11/1998 | Bauer et al. | 384/455 |
| 5,954,609 A * | 9/1999 | Fecko | 475/162 |
| 6,419,069 B1 * | 7/2002 | Teramachi | 193/35 R |
| 7,073,948 B2 * | 7/2006 | Neder et al. | 384/447 |
| 7,438,474 B2 * | 10/2008 | Chen | 384/51 |
| 7,637,664 B2 * | 12/2009 | Kiyosawa et al. | 384/455 |
| 8,235,597 B2 * | 8/2012 | Draser | 384/455 |
| 8,282,286 B2 * | 10/2012 | Kanai | 384/447 |
| 8,408,805 B2 * | 4/2013 | Winkler et al. | 384/455 |
| 8,540,092 B2 * | 9/2013 | Roodenburg et al. | 384/455 |
| 2009/0257697 A1 * | 10/2009 | Andersen | 384/455 |
| 2010/0044331 A1 * | 2/2010 | Roodenburg et al. | 212/253 |
| 2013/0084034 A1 * | 4/2013 | Ince et al. | 384/455 |

FOREIGN PATENT DOCUMENTS

| | | | |
|---|---|---|---|
| DE | 3812377 C1 * | 6/1989 | F16C 29/04 |
| DE | 10207595 A1 * | 9/2003 | F16C 33/38 |
| EP | 325680 A1 * | 8/1989 | F16C 23/10 |
| JP | 2009068679 A * | 4/2009 | |
| JP | 2009138883 A * | 6/2009 | |

* cited by examiner

COMBINED LOAD ROLLING BEARING

INCORPORATION BY REFERENCE

The following documents are incorporated herein by reference as if fully set forth: U.S. Provisional Application No. 61/760,936, filed Feb. 5, 2013.

FIELD OF INVENTION

This application is generally related to rolling bearings and more particularly related to combined load rolling bearings.

BACKGROUND

Rolling bearings are widely used in various mechanical applications, including the automotive field. Combined load rolling bearings include both axial rollers and radial rollers which are capable of supporting both radial and axial loads in a shaft system. Known combined load rolling bearings are disclosed in DE 859699 and DE 2810116. Combined load rolling bearings are suitable replacements for tapered roller bearings and typically have a similar capacity rating as tapered roller bearings.

Due to the varying loads supported by a combined load rolling bearing, the axial and radial rollers run at different rotational speeds. The rotational speed of the radial rollers ($N_r$) is related to the shaft speed ($N_s$), an inner diameter of an outer bearing ring ($ID_{outer}$), and an outer diameter of an inner bearing ring ($OD_{inner}$). The rotational speed of the radial rollers ($N_r$) is given below:

$$N_r = \frac{N_s}{1 + (ID_{outer} / OD_{inner})}$$

The rotational speed of the axial rollers ($N_a$) is 50% of the shaft rotational speed ($N_s$) without slip or skidding. The rotational speed of radial rollers ($N_r$) is inherently different than the rotational speed of the axial rollers ($N_a$). This inherent speed differential results in premature failure of the combined load rolling bearing due to skidding. This skidding results in undesirable friction and uneven wear, and negatively affects the performance of the combined load rolling bearing.

It is desirable to reduce the skidding of the rollers in a combined load rolling bearing. Therefore, a need exists for a combined load rolling bearing which accommodates the different rotational speeds of radial and axial rollers and that reduces skidding and friction caused by combining radial and axial rollers in a single bearing assembly.

SUMMARY

A combined load rolling bearing including a roller assembly with a first cage including a plurality of radial cylindrical rollers and a plurality of axial cylindrical rollers is provided. The radial cylindrical rollers are supported so that they can roll on a radially outer race of a first bearing ring and a radially inner race of a second bearing ring. The axial cylindrical rollers are supported so that they can roll on a first axial race of the first bearing ring and an intermediate axial ring. A needle roller assembly is supported between the intermediate axial ring and a second axial race of the second bearing ring. The needle roller assembly includes a second cage with a plurality of needle rollers, and the needle roller assembly rotates at a speed differential between the radial cylindrical rollers and the axial cylindrical rollers.

Preferred arrangements with one or more features of the invention are described below and in the claims.

BRIEF DESCRIPTION OF THE DRAWINGS

The foregoing Summary as well as the following Detailed Description will be best understood when read in conjunction with the appended drawings. In the drawings.

DETAILED DESCRIPTION OF THE PREFERRED EMBODIMENTS

Figure 1:
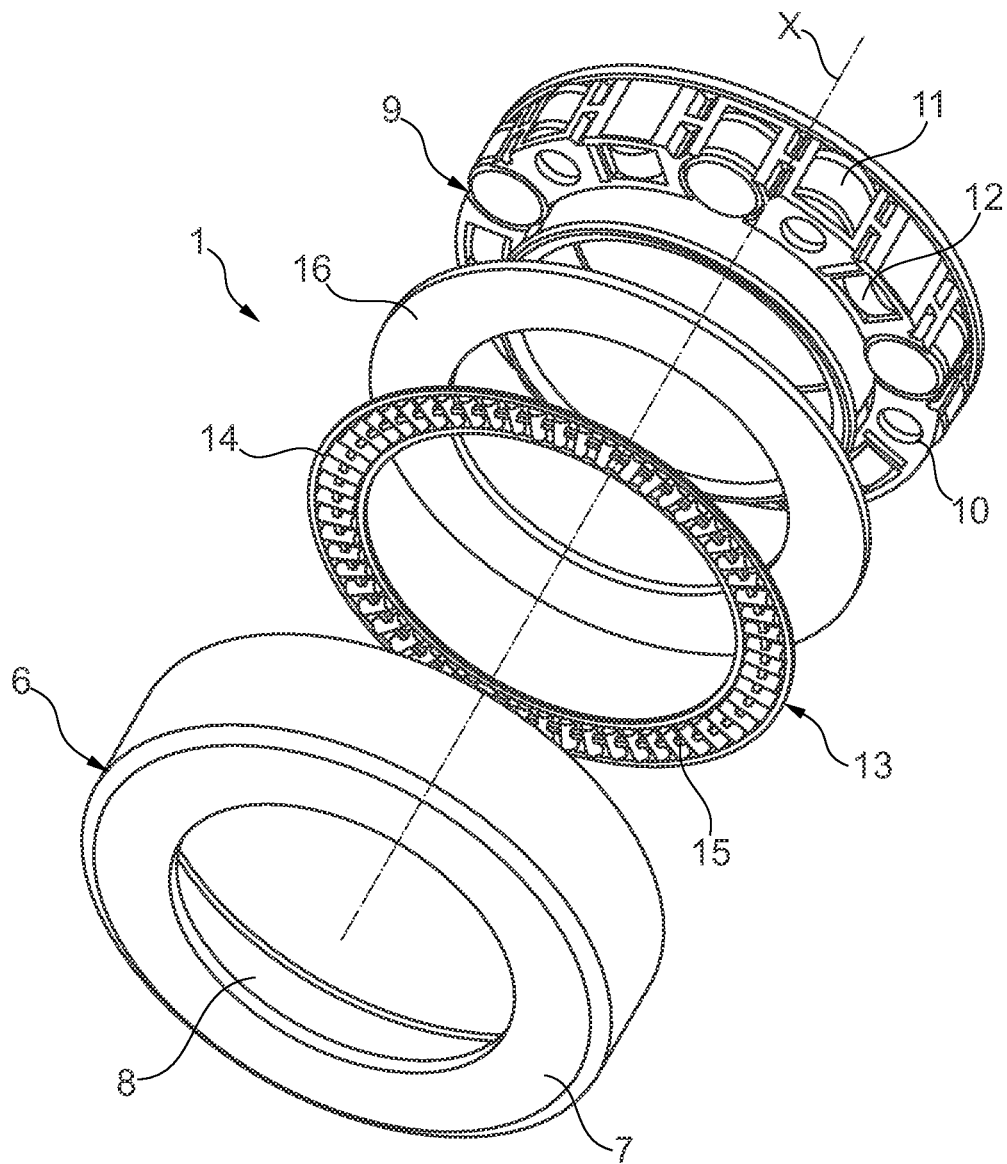
FIG. 1 is a perspective exploded view of a combined load rolling bearing according to the invention.

Certain terminology is used in the following description for convenience only and is not limiting. The words "inner," "outer," "inwardly," and "outwardly" refer to directions towards and away from the parts referenced in the drawings. A reference to a list of items that are cited as "at least one of a, b, or c" (where a, b, and c represent the items being listed) means any single one of the items a, b, c or combinations thereof. The terminology includes the words specifically noted above, derivates thereof, and words of similar import.

Figure 2:
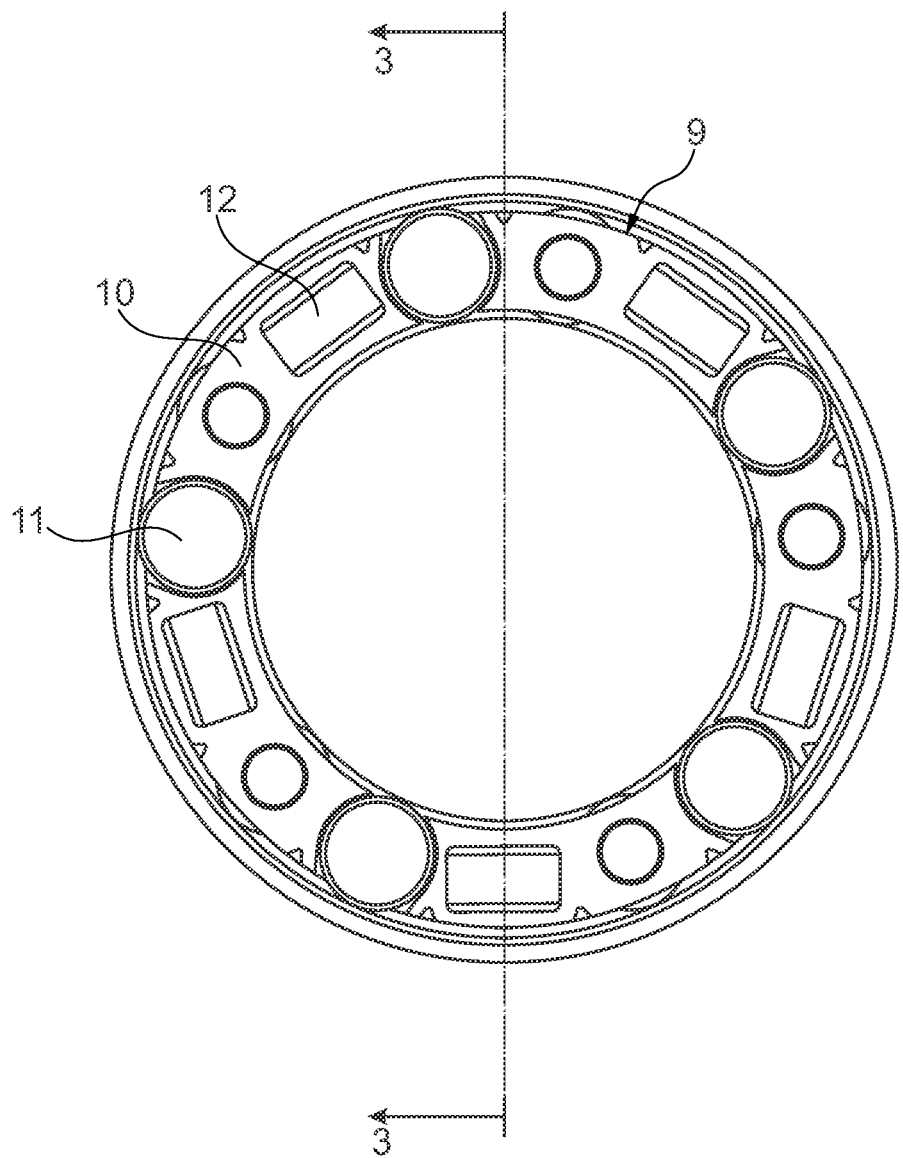
FIG. 2 is an elevational view of the roller assembly installed in the outer race.

FIG. 1 shows a preferred embodiment of the combined load rolling bearing 1 according to the present invention. The combined load rolling bearing 1 rotates about a rotational axis X and may be supported on a shaft. The combined load rolling bearing 1 includes a roller assembly 9 having a first cage 10 with a plurality of radial cylindrical rollers 11 and a plurality of axial cylindrical rollers 12, shown more clearly shown in FIG. 2. In the example embodiment shown, the ratio of radial cylindrical rollers 11 to axial cylindrical rollers 12 is 2 to 1. The ratio of radial cylindrical rollers 11 to axial cylindrical rollers 12 can be modified based on the requirements for a particular application.

The first cage 10 is formed as a unitary plastic part such as a high temperature nylon, for example. The first cage 10 includes reliefs and passages for conducting lubricant or oil flow to the radial and axial cylindrical rollers 11, 12. The first cage 10 may also include retaining elements for securing the radial and axial cylindrical rollers 11, 12.

Figure 3:
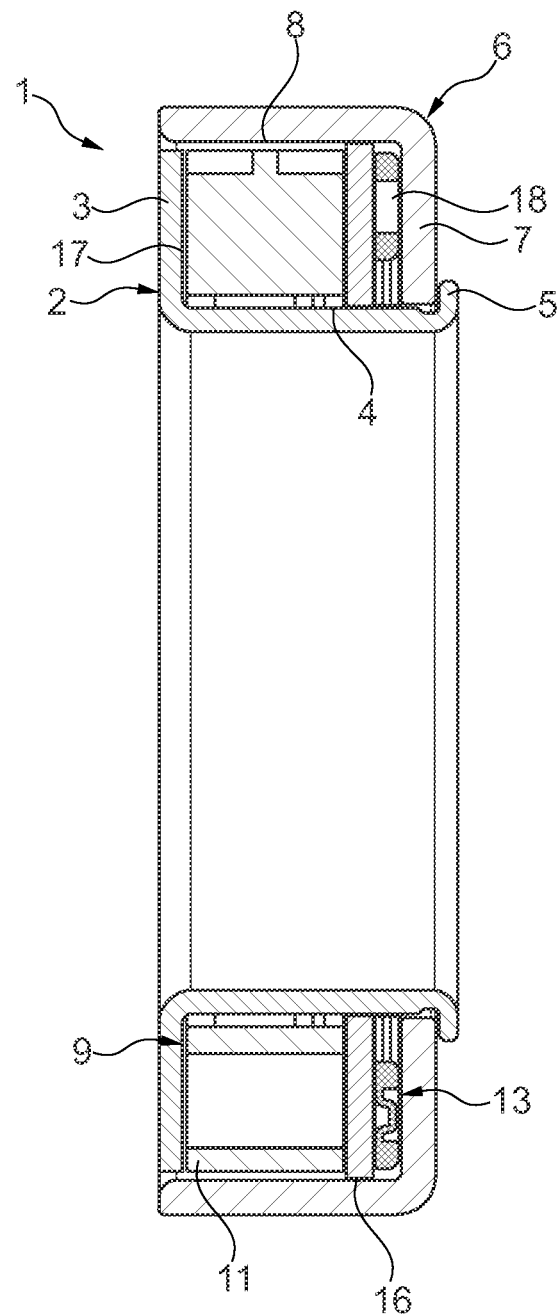
FIG. 3 is a cross-sectional view of the combined load rolling bearing taken along line 3-3 in FIG. 2.

As shown most clearly in FIG. 3, the radial cylindrical rollers 11 are supported so that they can roll on a radially inner race 4 on a radially outer surface of a first bearing ring 2 and a radially outer race 8 on a radially inner surface of a second bearing ring 6. The first bearing ring 2 also includes an outwardly extending first axial flange 3. The second bearing ring 6 also includes an inwardly extending axial flange 7. Processes for forming the first and second bearing rings 2, 6 are well known. The first and second bearing rings 2, 6 can be made from any suitable material having the desired hardness and load bearing characteristics, such as, for example and without limitation, through hardened or case hardened steel, that is punched and formed from steel sheet.

As shown in FIG. 3, when assembled, the first bearing ring 2 includes a retaining flange 5 that is bent behind the second bearing ring 6 to secure the bearing 1 together.

In order to carry axial loads, the axial cylindrical rollers 12 are supported so that they can roll on a first axial race 17 of the first bearing ring 2 and an intermediate axial ring 16. Due to different radial and axial loads, the axial cylindrical rollers 12 run at a different speed than the radial cylindrical rollers 11. This speed differential results in friction and skidding, which is undesirable in bearing applications. To compensate the speed differential, a needle roller assembly 13 is provided. The needle roller assembly 13 is supported between the intermediate axial ring 16 and a second axial race 18 of the second bearing ring 6. The intermediate axial ring 16 therefore has two races on opposite sides and bears the entire axial load of the combined load rolling bearing 1. In the example embodiment shown, the intermediate axial ring 16 is formed from steel that is hardened.

The needle roller assembly 13 includes a second cage 14 with a plurality of needle rollers 15. The second cage 14 is formed as a unitary plastic part such as a high temperature nylon, for example. The second cage 14 holds the needle rollers 15 in position. The needle roller assembly 13 runs at a fraction of the rotational speed of the combined load rolling bearing 1. The rotational speed of the needle roller assembly 13 ($N_n$) is related to the rotational speed of a shaft ($N_s$), and a ratio (R) of an inner diameter (ID) of the second bearing ring 6 to an outer diameter (OD) of the first bearing ring 2. The rotational speed of the needle roller assembly 13 ($N_n$) is given below:

$$N_n = \frac{N_s}{2}\left(\frac{R-1}{R+1}\right)$$

The rotational speed of the needle roller assembly 13 ($N_n$) is less than the rotational speed of a shaft ($N_s$). Accordingly, the needle roller assembly 13 can have a lower capacity due to its lower rotational speed. In the example embodiment shown, the ratio of needle rollers 15 to axial cylindrical rollers 12 is 10 to 1. The ratio of needle rollers 15 to axial cylindrical rollers 12 may be modified based on the requirements for a particular application of the combined load rolling bearing 1.

Having thus described various embodiments of the present combined load rolling bearing in detail, it is to be appreciated and will be apparent to those skilled in the art that many physical changes, only a few of which are exemplified in the detailed description above, could be made in the apparatus without altering the inventive concepts and principles embodied therein. The present embodiments are therefore to be considered in all respects as illustrative and not restrictive, the scope of the invention being indicated by the appended claims rather than by the foregoing description, and all changes which come within the meaning and range of equivalency of the claims are therefore to be embraced therein.

LOG TO REFERENCE NUMBERS

1 Combined Load Rolling Bearing
2 First Bearing Ring
3 Outwardly Extending Axial Flange
4 Inner Radial Race
5 Flange
6 Second Bearing Ring
7 Inwardly Extending Axial Flange
8 Outer Radial Race
9 Roller Assembly
10 First Cage
11 Plurality of Radial Cylindrical Rollers
12 Plurality of Axial Cylindrical Rollers
13 Needle Roller Assembly
14 Second Cage
15 Needle Rollers
16 Intermediate Axial Ring
17 First Axial Race
18 Second Axial Race
X Rotation Axis of Combined Load Rolling Bearing

What is claimed is:

1. A combined load rolling bearing, comprising:
   a roller assembly including a first cage with a plurality of radial cylindrical rollers and a plurality of axial cylindrical rollers,
   the radial cylindrical rollers are supported to roll on a radially outer race on a radially inner surface of a first bearing ring and a radially inner race on a radially outer surface of a second bearing ring,
   the axial cylindrical rollers are supported to roll on a first axial race of the first bearing ring and an intermediate axial ring, and
   a needle roller assembly supported between the intermediate axial ring and a second axial race of the second bearing ring, the needle roller assembly including a second cage with a plurality of needle rollers, the needle roller assembly arranged to rotate at a speed differential between the radial cylindrical rollers and the axial cylindrical rollers.

2. The combined load rolling bearing assembly of claim 1, wherein a ratio of a number of needle rollers to a number of axial cylindrical rollers is at least 10 to 1.

3. The combined load rolling bearing assembly of claim 1, wherein a ratio of a number of radial cylindrical rollers to a number of axial cylindrical rollers is 2 to 1.

4. The combined load rolling bearing assembly of claim 1, wherein the first cage is integrally formed as a unitary plastic part.

5. The combined load rolling bearing assembly of claim 1, wherein the second cage is integrally formed as a unitary plastic part.

6. The combined load rolling bearing assembly of claim 1, wherein the intermediate axial ring has a Rockwell hardness of 60.

7. A combined load rolling bearing, comprising:
   a roller assembly with a plurality of radial cylindrical rollers and a plurality of axial cylindrical rollers, the plurality of radial cylindrical rollers and the plurality of axial cylindrical rollers are aligned with each other in a circumferential direction in a single row, and
   a needle roller assembly adjacent to the roller assembly and arranged to rotate at a speed differential between the radial cylindrical rollers and the axial cylindrical rollers.

8. The combined load rolling bearing of claim 7, wherein the roller assembly includes a first cage for securing the radial cylindrical rollers and the axial cylindrical rollers.

9. The combined load rolling bearing of claim 8, wherein the radial cylindrical rollers are supported to roll on a radially outer race on a radially inner surface of a first bearing ring and a radially inner race on a radially outer surface of a second bearing ring, and the axial cylindrical rollers are supported to roll on a first axial race of the first bearing ring and an intermediate axial ring.

10. The combined load rolling bearing of claim 9, wherein the needle roller assembly is supported between an intermediate axial ring and a second axial race of the second bearing ring, the needle roller assembly including a second cage for securing a plurality of needle rollers.

\* \* \* \* \*